United States Patent [19]

Joseph et al.

[11] Patent Number: 4,780,371

[45] Date of Patent: Oct. 25, 1988

[54] ELECTRICALLY CONDUCTIVE COMPOSITION AND USE THEREOF

[75] Inventors: Charles A. Joseph, Candor; James R. Petrozello, Endicott, both of N.Y.

[73] Assignee: International Business Machines Corporation, Armonk, N.Y.

[21] Appl. No.: 832,195

[22] Filed: Feb. 24, 1986

[51] Int. Cl.$^4$ .............................................. H01B 1/06
[52] U.S. Cl. .................................... 428/414; 428/415; 428/416; 252/512; 252/513; 252/514; 523/457; 523/458; 523/454
[58] Field of Search ...................... 252/514, 512, 513; 523/457–459, 427; 428/414, 415, 416

[56] References Cited

U.S. PATENT DOCUMENTS

| | | | |
|---|---|---|---|
| Re. 31,411 | 10/1983 | Bolon et al. | 252/501.1 |
| 2,947,646 | 8/1960 | Devaney et al. | 106/193 |
| 3,385,799 | 5/1968 | Hoffman | 252/514 |
| 3,407,081 | 10/1968 | Ballard | 106/1 |
| 3,537,892 | 11/1970 | Milkovich et al. | 117/227 |
| 3,717,483 | 2/1973 | Miller | 106/1 |
| 3,746,662 | 7/1973 | Adelman | 252/513 |
| 4,032,350 | 6/1977 | Greenstein | 106/1 |
| 4,210,704 | 7/1980 | Chandross | 428/414 |
| 4,391,742 | 7/1983 | Steigerwald et al. | 252/512 |
| 4,410,457 | 10/1983 | Fujimura et al. | 252/514 |
| 4,436,785 | 3/1984 | Dietz et al. | 428/427 |
| 4,459,166 | 7/1984 | Dietz et al. | 156/89 |

*Primary Examiner*—J. L. Barr
*Attorney, Agent, or Firm*—Pollock, Vande Sande & Priddy

[57] ABSTRACT

An electrically conductive composition containing a photosensitive epoxy polymer, a reactive plasticizer, and electrically conductive spherical particles wherein the outer surfaces are of a material selected from the group of platinum, palladium and gold. The compositions are used to provide a flexible electically conductive bond between a supporting substrate and a semiconductor.

23 Claims, No Drawings

ELECTRICALLY CONDUCTIVE COMPOSITION AND USE THEREOF

DESCRIPTION

1. Field of the Invention

The present invention is concerned with a photosensitive electrically conductive epoxy polymer composition and use thereof to provide a flexible electrically conductive bond between a supporting substrate and a semiconductor. The epoxy compositions of the present invention contain certain electrically conductive particles and a plasticizer which is reactive with the epoxy polymer component.

2. Background Art

In the preparation of integrated circuit modules, the integrated circuit semiconductor chip such as a silicon or polycrystalline silicon chip is attached or bonded to a substrate containing the required circuitry. Presently, the semiconductor chips are bonded to the substrates by employing various solder compositions.

One of the main concerns with the use of solder is the tendency of the solder joints or bonds to crack due to thermal cycling and corrosion by atmospheric contaminants. Although the problem of cracking has been minimized by providing sealant coatings to hermetically seal the chip and bond from the atmosphere, cracking due to fatigue from thermal cycling (i.e. expansion and contraction due to temperature changes) still occurs to some extent. The solder bonds are rigid and the amount of expansion and contraction which occurs in the solder bonds differ from the amount of expansion and contraction due to thermal cycling which occurs on the chips and/or substrates. Moreover, stress is placed on the solder bonds due to thermal cycling because of the difference in the degree of expansion and contraction between the semiconductor and supporting substrate.

SUMMARY OF THE INVENTION

The present invention is concerned with an electrically conductive composition. The composition contains (a) about 15–65% by weight of a photosensitive epoxy polymer component; (b) about 1 to about 15% by weight of a plasticizer; and (c) about 25 to about 80% by weight of electrically conductive particles. The above amounts of (a), (b) and (c) are based upon the total weight of (a), (b) and (c) in the composition. The plasticizer employed is reactive with the epoxy polymer component. The electrically conductive particles have electrically conductive outer surfaces selected from the group of platinum, palladium, gold or mixtures thereof. Also, the electrically conductive particles are spherical in shape.

In addition, the present invention is concerned with a product which comprises a substrate and a semiconductor wherein the semiconductor and substrate are bonded together by the above-defined electrically conductive composition.

Another aspect of the present invention is a method of bonding a semiconductor to a substrate by applying to at least one of the semiconductors and substrates an electrically conductive composition as defined hereinabove. The substrate and semiconductor with the electrically conductive composition interposed therebetween is brought together and the electrically conductive composition is permitted to harden to thereby form the necessary bond.

BEST AND VARIOUS MODES FOR CARRYING OUT INVENTION

The electrically conductive bonding compositions employed in accordance with the present invention form a flexible and electrically conductive bond between the semiconductor and substrate. In view of the flexible nature of the compositions, cracking of the bond or joint between the semiconductor and substrate due to thermal cycling is significantly reduced, if not entirely eliminated. The compositions provide for the expansion and contraction mismatch that occurs between the semiconductor and substrate and thereby eliminating bond joint connection cracking and failure. Moreover, since the particular compositions of the present invention actually form their own protective seal and are chemically inert, it is possible to eliminate the need for sealants or coatings to the chip bond area as now employed when using solder bonds. This is important since, as chip bond sites increase, completely coating all of the bond sites due to the density and pattern is quite difficult.

The photosensitive epoxy polymer component employed in the present invention includes epoxy polymers containing ethylenic unsaturated groups such as reaction products of monoethylenically unsaturated acid and an epoxy. The monoethylenically unsaturated carboxylic acid is an $\alpha,\beta$ ethylenically unsaturated carboxylic acid and are well known in the art. Examples of such acids are acrylic acid, methacrylic acid, and crotonic acid. The epoxy polymer pre-reacted with the carboxylic acid can be any of a variety of epoxy polymers. For instance, such is preferably bisphenol A-diglycidyl ether such as a bisphenol A-epichlorohydrin epoxy polymer. The epoxide has the general formula:

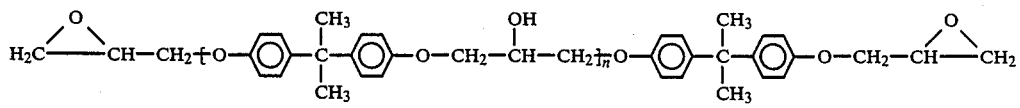

It can be liquid or solid depending upon the molecular weight which generally ranges from about $3 \times 10^2$ to about $10 \times 10^4$. The n in the above formula generally varies from about 0.2 to about 100, and preferably from about 0.2 to about 25, and most preferably up to about 10.

Other epoxy polymers which can be employed are the epoxidized novolak of the formula:

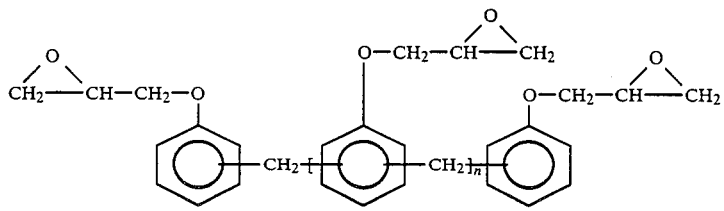

This epoxy polymer can be a liquid, semisolid or solid, depending upon its molecular weight. Epoxy polymers wherein n is 1.5 to 3.5 are commercially available and are generally suitable. Mixtures of epoxy polymers with differing molecular weights or different types of epoxy polymers can be employed when desired.

The relative amount of the monoethylenically unsaturated acid to the epoxy polymer is such as to react stoichiometrically with from about 25 to about 100% of the epoxide functionality of the polymer and preferably with about 25 to about 75% of the epoxide functionality.

The pre-reaction products are believed to be addition products formed by the following:

Such materials are well known and commercially available. For instance one such material is obtainable under the trade designation UV-15 from Masterbond, Inc., Englewood, N.J. and is an adduct of epichlorohydrin-bisphenol A having a molecular weight of about 16,000 to about 20,000, and epoxy value of about 0.48 to about 0.52 equivalent weight per hundred grams and a weight of about 192 to about 208 per epoxide.

The compositions of the present invention contain about 15 to about 65% by weight, and preferably about 35 to about 45% by weight of the photosensitive epoxy polymer component. These percentages are based upon the total of the photosensitive epoxy polymer component, reactive plasticizer, and electrically conductive particles present in the composition.

In addition, the compositions include a plasticizer which is reactive with the epoxy polymer component. Suitable plasticizers include glycidyl ethers, glycidyl esters, diol diglycidyl ethers, diol diglycidyl esters, olefin oxides, polyalkylene glycols and/or polyoxyalkylene glycols. Mixtures of the plasticizers can be employed if desired.

The polyalkylene glycol or polyoxyalkylene glycol can be represented by the formula:

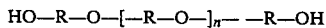

wherein R is a divalent saturated aliphatic hydrocarbon moiety selected from the group of ethylene, propylene, butylene and mixtures thereof. These groups can be straight or branch chained.

Examples of some specific glycols include polyethylene glycol, polypropylene glycol, polyoxyethyleneoxypropylene and polybutylene glycol. The preferred glycol employed is a polyethylene glycol and preferably having a molecular weight of about 7,000 to about 10,000. Such is available under the trade designation from polyglycol DY-040 from Ciba-Geigy Co.

Examples of glycidyl ethers and glycidyl esters are allyl glycidyl ether and the alkyl and aryl glycidyl ethers and glycidyl esters such as butyl glycidyl ether; cresyl glycidyl ether; glycidyl methacrylate; and phenyl glycidyl ether. A particular olefin oxide is styrene oxide.

The amount of reactive plasticizer employed is about 1 to about 15% by weight and preferably about 1 to about 10% by weight. These percentages are based upon the total of the photosensitive epoxy polymer component reactive plasticizer and electrically conductive particles present in the composition.

In addition, the compositions of the present invention must include electrically conductive particles. The outer surfaces of the particles must be electrically conductive and must be from the group of platinum, palladium, gold or mixtures thereof or alloys thereof.

In addition, the particles must be spherical in shape. It is critical to the success of the present invention to provide the necessary conductivity that the particles be spherical in shape as contrasted to other conventional shapes such as leaf-like and flake.

Moreover, at least the outer surfaces of the electrically conductive particles must be of platinum, palladium, gold, mixtures thereof or alloys thereof. In the preferred aspects of the present invention, the particles employed are entirely of the desired metal and are hollow microspheres. However, particles wherein the outer coating is provided by a platinum, palladium and/or gold coating can be employed if desired. Furthermore, the particles although preferably hollow can be solid. The particles generally have diameters of about 0.0001" to about 0.0008", and preferably about 0.0003" to about 0.0005". Typical spherical particles are gold microspheres obtainable from SEL-REX Co.

The amount of electrically conductive particles is about 25 to about 85% by weight and preferably about 35 to about 60% by weight. These percentages are based upon the total of the photosensitive epoxy polymer component reactive plasticizer and electrically conductive particles in the composition.

In the preferred aspects of the present invention, an epoxy polymer which is not photosensitive is employed. Such is preferably, but not necessarily, the same type of epoxy as used to react with the carboxylic acid to provide the photosensitive epoxy component. The preferred epoxies are those from bisphenol A-epichlorohydrin. An example of which is Aralite 6010 from Ciba-Geigy and having an average molecular weight of about 350 to about 400, an epoxy equivalent of about 185 to about 200, and a viscosity of about 10,000 to about 16,000 centipoise at 25° C.

When a non-photosensitive epoxy is employed, it is also desirable to include an anhydride hardening agent and an accelerator for facilitating the epoxy cure. It is desirable to employ about 1 part by weight of the anhydride per 2 parts by weight of the nonphotosensitive epoxy component.

Examples of some suitable acid anhydride hardening acids are tetrahydrophthalic acid anhydride, pyromellitic acid anhydride, and nadic methyl phthalic anhydride.

Examples of suitable accelerating agents include polyamines, primary, secondary, and tertiary amines, polyamides, Lewis acid catalysts such as $BF_3$, and complexes thereof.

Those compositions that include the non-photosensitive epoxy resin generally contain about 15% to about 35% by weight, preferably about 20% to about 30% by weight of the photosensitive epoxy component; about 1% to about 4% of the reactive plasticizer; about 25% to about 45% by weight, preferably about 30% to about 40% by weight of the electrically conductive particles; about 20% to about 45% by weight, preferably about 20% to about 30% by weight of the non-photosensitive epoxy component; about 10% to about 25% by weight, preferably about 10% to about 15% by weight of the anhydride; and about 0.1% to about 3% by weight of the accelerator. These percentages are based upon the total of the photosensitive epoxy polymer, the plasticizer, the electrically conductive particles, the nonphotosensitive epoxy polymer, the anhydride, and the accelerator in the composition.

Moreover, the compositions can further include a photoinitiator or sensitizer. Many such materials are well-known in the prior art. Examples of some suitable photoinitiators include anthraquinone and substituted anthraquinone such as the alkyl substituted, halo substituted anthraquinones including 2-tert-2-butyl anthraquinone, 1-chloroanthraquinone, p-chloroanthraquinone, 2-methylanthraquinone, 2-ethylanthraquinone and octamethylanthraquinone; other substituted or unsubstituted polynuclearquinones including 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthacenequinone, and 1,2,3,4-tetrahydrobenzantracene-7,12-dione.

Other photosensitizers include halogen-type sensitizers such as carbon tetrachloride, bromoform and carbon tribromide; benzotriazole; benzoin, chloranil, benzyl, diacetyl, 5-nitrosalicylaldehyde, and 2,4-dinitrotoluene.

If desired, mixtures of photoinitiators can be employed.

When employed, the photoinitiator is employed in amounts sufficient to sensitize the composition to ultraviolet light and is generally from about 0.1 to about 10% and preferably from about 0.1 to about 5%.

The semiconductors bonded pursuant to the present invention are preferably of silicon or polycrystalline silicon. However, other semiconductors such as those known in the art including III–V group mixed semiconductors and II–VI group mixed semiconductors ca be employed.

The substrate to which the semiconductor is bonded is preferably a ceramic substrate. A ceramic is a product or material manufactured by the action of heat on earthy raw materials. The preferred ceramic substrates include silicon oxides and silicates such as aluminum silicate and aluminum oxides. The ceramic substrates are relatively rigid which contributes to the problem of cracking of the joint between the semiconductor and the substrate experienced in the prior art due to thermal cycling.

The articles prepared pursuant to the present invention are preferably obtained by first depositing a coating of the electrically conductive compositions of the present invention on both the semiconductor and on those areas of the substrate to which the semiconductor is to be bonded.

The compositions are then permitted to partially cure from room temperature to about 75° C. for about 30 minutes to about 120 minutes.

The compositions are then selectively exposed to ultraviolet light in those areas which are to remain to form the desired contact area and circuitry. Preferably, the exposure is to ultraviolet light of about 300 to about 400 millimicrons for about 1 to about 20 minutes. This causes partial polymerization of the composition in the exposed areas. Next, the coatings are contacted with an organic solvent such as methyl chloroform in order to strip away or remove those portions of the coating which were not exposed to the ultraviolet light thereby leaving the desired areas to be contacted and the desired circuitry.

Next, the coatings are exposed a second time to ultraviolet light of about 180 to about 250 millimicrons in order to activate the coating compositions to cause such to flow and then the substrate and semiconductor are placed in contact with each other with the composition intermediate between the two. This results in forming a bond between the semiconductor and the supporting substrate. The coating is then permitted to completely polymerize thereby forming a flexible electrically conductive bond.

The following non-limiting typical formulation is presented to further illustrate the present invention:

A composition containing about 25.8% by weight of UV-15 (photosensitive epoxy component); about 2% by weight of Polyol BASF 7V (reactive plasticizer); about 35% by weight of gold microspheres from SelRex; about 25% by weight of Araldite 6010 (epoxy component); about 12% by weight of nadic methyl phtholic anhydride (Geigy 906); and about 0.2% by weight of benzyl dimethylamine (DY062) is obtained.

A silicon semiconductor chip and those areas of a ceramic substrate to which the chip is to be bonded are coated with the above composition.

The composition is permitted to partially cure at about 50° C. for about 60 minutes.

The compositions are then selectively exposed to ultraviolet light of about 300 to about 400 millimicrons for about 10 minutes in those areas which are to remain to form the desired contact area and circuitry. Next, the coatings are contacted with methyl chloroform to remove the unexposed portions of the coating.

The coatings are next exposed to ultraviolet light of about 180 to about 250 millimicrons in order to activate the coating compositions to cause such to flow. The substrate and semiconductor are placed in contact with each other with the composition intermediate between the two. The coating is then permitted to completely polymerize, thereby forming a flexible electrically conductive bond.

Having thus described our invention, what we claim as new and desire to secure by Letters Patent is:

1. A product comprising a substrate and a semiconductor wherein the semiconductor and substrate are bonded together by a composition containing:

(A) about 15 to 65% by weight of a photosensitive epoxy polymer component;
(B) about 1 to about 15% by weight of a plasticizer reactive with said epoxy component; and
(C) about 25 to about 80% by weight of electrically conductive particles having electrically conductive outer surfaces selected from the group of platinum, palladium, gold or mixtures thereof, and being spherical in shape;

wherein the above amounts of (A), (B) and (C) are based upon the total weight of (A), (B) and (C) and wherein said composition provides electrical conductivity between said semiconductor and said substrate.

2. The product of claim 1 wherein said epoxy polymer is a reaction product of an $\alpha, \beta$ ethylenically unsaturated carboxylic acid and epichlorohydrinbisphenol A epoxy.

3. The product of claim 1 wherein the plasticizer is a polyalkylene glycol, or polyoxyalkylene glycol, or mixtures thereof.

4. The product of claim 1 wherein said plasticizer is polyethylene glycol.

5. The product of claim 1 wherein said particles are hollow.

6. The product of claim 1 wherein said particles are hollow gold particles.

7. The product of claim 1 which contains about 35% to 45% by weight of (A), about 1% to about 10% by weight of (B), and about 35% to about 60% by weight of (C).

8. The product of claim 1 wherein said semiconductor is silicon or polycrystalline silicon.

9. The product of claim 8 wherein said substrate is a ceramic substrate.

10. The product of claim 1 wherein said substrate is a ceramic substrate.

11. The product of claim 1 wherein said composition further contains a (D) non-photosensitive epoxy polymer and (E) an anhydride and wherein the amount of (A) is about 15% to about 35% by weight, the amount of (B) is about 1 to about 4% by weight, the amount of (C) is about 25% to about by weight, the amount of (D) is about 20% to about 45% by weight, and the amount of (E) is about 10% to about 25% by weight.

12. The product of claim 11 wherein said composition further contains about 0.1% to about 3% by weight of an accelerator.

13. An electrically conductive composition containing:

(A) about 15 to 65% by weight of a photosensitive epoxy polymer;
(B) about 1 to about 15% by weight of a plasticizer reactive with said epoxy polymer component; and
(C) about 25 to about 80% by weight of electrically conductive particles having electrically conductive outer surfaces selected from the group of platinum, palladium, gold or mixtures thereof, and being spherical in shape;

wherein the above amounts of (A), (B) and (C) are based upon the total weight of (A), (B), and (C).

14. The composition of claim 13 wherein said epoxy polymer is a reaction product of an $\alpha, \beta$ ethylenically unsaturated carboxylic acid and epichlorohydrin bisphenol A epoxy.

15. The composition of claim 13 wherein the plasticizer is a polyalkylene glycol, or polyoxyalkylene glycol, or mixtures thereof.

16. The composition of claim 13 wherein said plasticizer is polyethylene glycol.

17. The composition of claim 13 wherein said particles are hollow.

18. The composition of claim 13 wherein said particles are hollow gold particles.

19. The composition of claim 13 which contains about 35% to 45% by weight of (A), about 1% to about 10% by weight of (B), and about 35% to about 60% by weight of (C).

20. The product of claim 1 wherein said substrate is a ceramic substrate, said semiconductor is silicon or polycrystalline silicon, said epoxy polymer is a reaction product of an $\alpha,\beta$ ethylenically unsaturated carboxylic acid and epichloroxydiin bisphenol A epoxy, said plasticizer is polyethylene glycol, and said particles are hollow gold particles.

21. The product of claim 20 which contains about 35% to 45% by weight of (A), about 1% to about 10% by weight of (B), and about 35% to about 60% by weight of (C).

22. The product of claim 1 which further contains (D) non-photosensitive epoxy polymer and (E) an anhydride, and wherein the amount of (A) is about 15% to about 35% by weight, the amount of (B) is about 1% to about 4% by weight, the amount of (C) is about 25% to about 45% by weight, the amount of (D) is about 20% to about 45% by weight, and the amount of (E) is about 10% to about 25% by weight.

23. The composition of claim 22 which also includes about 0.1% to about 3% by weight of an accelerator.

* * * * *